(12) United States Patent
Kadowaki et al.

(10) Patent No.: US 12,336,335 B2
(45) Date of Patent: Jun. 17, 2025

(54) LIGHT-EMITTING ELEMENT AND METHOD OF PRODUCING THE SAME

(71) Applicant: DOWA Electronics Materials Co., Ltd., Tokyo (JP)

(72) Inventors: Yoshitaka Kadowaki, Akita (JP); Shogo Sakuraba, Akita (JP); Osamu Tanaka, Akita (JP)

(73) Assignee: DOWA Electronics Materials Co., Ltd., Tokyo (JP)

( * ) Notice: Subject to any disclaimer, the term of this patent is extended or adjusted under 35 U.S.C. 154(b) by 491 days.

(21) Appl. No.: 17/755,332

(22) PCT Filed: Oct. 23, 2020

(86) PCT No.: PCT/JP2020/039984
§ 371 (c)(1),
(2) Date: Apr. 27, 2022

(87) PCT Pub. No.: WO2021/085340
PCT Pub. Date: May 6, 2021

(65) Prior Publication Data
US 2022/0406967 A1 Dec. 22, 2022

(30) Foreign Application Priority Data
Oct. 31, 2019 (JP) ................. 2019-199209

(51) Int. Cl.
*H10H 20/824* (2025.01)
*H10H 20/01* (2025.01)
(Continued)

(52) U.S. Cl.
CPC ...... *H10H 20/8242* (2025.01); *H10H 20/013* (2025.01); *H10H 20/812* (2025.01); *H10H 20/8162* (2025.01); *H10H 20/857* (2025.01)

(58) Field of Classification Search
CPC ... H01L 33/305; H01L 33/0062; H01L 33/06; H01L 33/145; H01L 33/62; H01L 33/38;
(Continued)

(56) References Cited

U.S. PATENT DOCUMENTS 5,777,349 A * 7/1998 Nakamura ........... H10H 20/824
257/97
5,995,529 A 11/1999 Kurtz et al.
(Continued)

FOREIGN PATENT DOCUMENTS

CN 101127383 A 2/2008
JP 2015534270 A 11/2015
(Continued)

OTHER PUBLICATIONS

Stein, A., et al., "InAs(P,Sb)/InAsSb LEDs emitting in the 3-4 μm range at room temperature," proceedings of: 11th International Conference on Indium Phosphide and Related Materials, pp. 95-98 (Year: 1999).*

(Continued)

*Primary Examiner* — Fernando L Toledo
*Assistant Examiner* — Ryan T. Fortin
(74) *Attorney, Agent, or Firm* — KENJA IP LAW PC

(57) ABSTRACT

In a light-emitting element including a first InAs layer that is undoped or doped with an n-type dopant; an active layer including one or more $InAs_ySb_{1-y}$ layers ($0<y<1$); and a second InAs layer doped with a p-type dopant, an $Al_xIn_{1-x}As$ electron blocking layer ($0.05 \leq x \leq 0.40$) with a thickness of 5 nm to 40 nm is provided between the active layer and the second InAs layer.

6 Claims, 10 Drawing Sheets

(51) Int. Cl.
  *H10H 20/812* (2025.01)
  *H10H 20/816* (2025.01)
  *H10H 20/857* (2025.01)

(58) Field of Classification Search
  CPC .. H01L 33/30; H10H 20/8242; H10H 20/013; H10H 20/812; H10H 20/8162; H10H 20/857
  See application file for complete search history.

(56) References Cited

U.S. PATENT DOCUMENTS

| | | |
|---|---|---|
| 2018/0233534 A1 | 8/2018 | Kondo |
| 2019/0273182 A1* | 9/2019 | Tasaki .................... H01L 33/22 |

FOREIGN PATENT DOCUMENTS

| | | |
|---|---|---|
| JP | 2018006495 A | 1/2018 |
| JP | 2019009438 A | 1/2019 |
| JP | 2019057639 A | 4/2019 |

OTHER PUBLICATIONS

Heber, J. D., et al., "Room temperature InAs/InAs1-xSbx single quantum well light emitting diode with barriers for improved carrier confinement," IEE Proceedings—Optoelectronics, vol. 147, iss. 6, pp. 407-411 (Year: 2000).*

Yokoyama, H., et al., "Reduction of In Composition in Heavily Zn-Doped InAlGaS Layers Grown at Low Temperature by Metalorganic Chemical Vapor Deposition," Japanese Journal of Applied Physics 51, pp. 025601-1-025601-4 (Year: 2012).*

Biefeld, R. M., et al., "The Growth of InAsSb/InAsP Strained-Layer Superlattices for Use in Infrared Emitters," Journal of Electronic Materials, vol. 26 (10), pp. 1225-1230 (Year: 1997).*

Pullin, Mark, et al., "Improved efficiency positive and negative luminescent light emitting devices for mid-infrared gas sensing applications", Proceedings of SPIE, vol. 3938, pp. 144-153 (Year: 2000).*

Reier, F. W., et al., "Doping characteristics of undoped and Zn-doped In(Ga)AlAs layers grown by low-pressure metalorganic vapour phase epitaxy", Journal of Crystal Growth 135, pp. 463-468 (Year: 1994).*

A. A. Allerman et al., InAsSb-based mid-infrared lasers (3. 8-3. 9 μm) and light-emitting diodes with AlAsSb claddings and semimetal electron injection, grown by metalorganic chemical vapor deposition, Applied Physics Letters, Jul. 1996, pp. 465-467, vol. 69, No. 4.

Dec. 28, 2020, International Search Report issued in the International Patent Application No. PCT/JP2020/039984.

Jan. 5, 2021, Notification of Reasons for Refusal issued by the Japan Patent Office in the corresponding Japanese Patent Application No. 2019-199209.

Jul. 6, 2021, Office Action issued by the Taiwan Intellectual Property Office in the corresponding Taiwanese Patent Application No. 109137644.

Jun. 29, 2021, Decision of Refusal issued by the Japan Patent Office in the corresponding Japanese Patent Application No. 2019-199209.

S. R. Kurtz et al., Midinfrared lasers and light-emitting diodes with InAsSb/InAsP strained-layer superlattice active regions, Applied Physics Letters, Jun. 1997, vol. 70, No. 24, pp. 3188-3190.

May 3, 2022, International Preliminary Report on Patentability issued in the International Patent Application No. PCT/JP2020/039984.

B. Grietens et al., Growth and characterisation of mid-IR InAs0.9Sb0.1/InAs strained multiple quantum well light emitting diodes grown on InAs substrates, IEE Proc.-Optoelectron., Oct. 1997, pp. 295-298, vol. 144, No. 5.

C. Van Hoof et al., Mid-infrared LEDs using InAs0.71Sb0.29/InAs/Al0.25In0.75As/InAs Strained-layer Superlattice active layers, ASDAM '98, 2nd International Conference on Advanced Semiconductor Devices and Microsystems, Oct. 1998, pp. 287-290.

Jul. 15, 2024, Office Action issued by the China National Intellectual Property Administration in the corresponding Chinese Patent Application No. 202080075882.1.

* cited by examiner

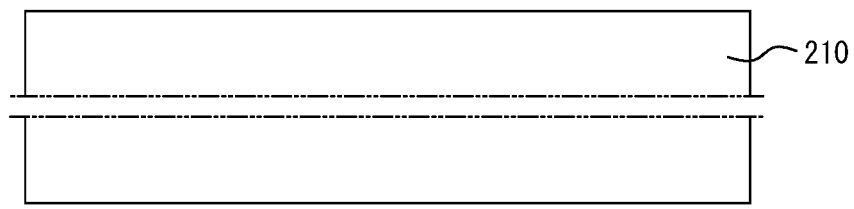
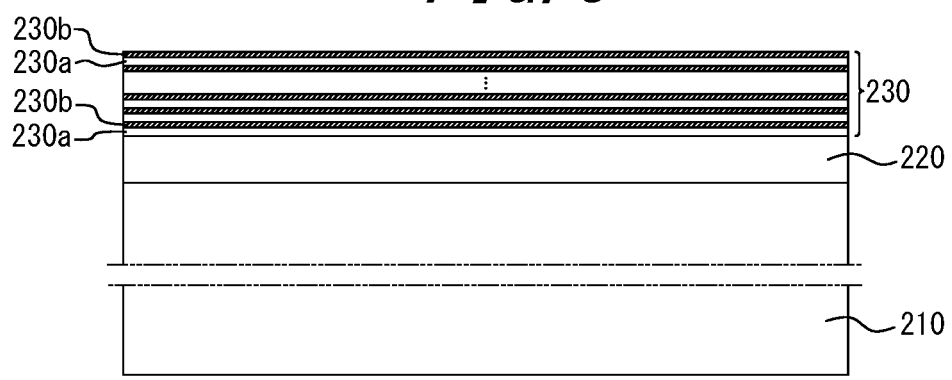
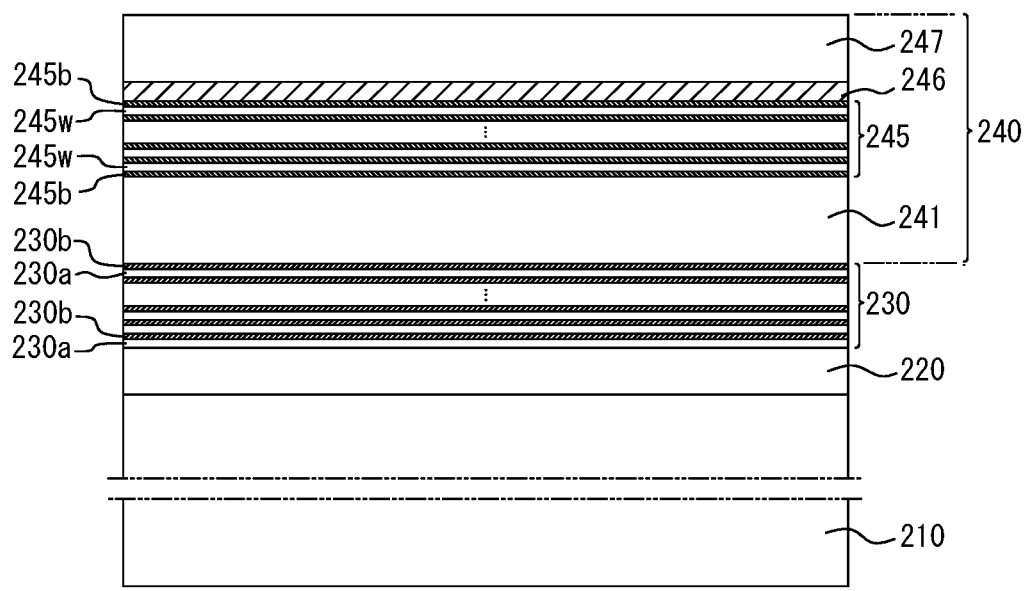

265
291

291
265

LIGHT-EMITTING ELEMENT AND METHOD OF PRODUCING THE SAME

TECHNICAL FIELD

This disclosure relates to a light-emitting element and a method of producing the same, and particularly relates to an infrared emission semiconductor light-emitting element.

BACKGROUND

Conventionally, semiconductor optical devices which emit or receive light in the mid-infrared region, such as mid-infrared emission semiconductor light-emitting elements which emit light with wavelengths of 1700 nm or more in the mid-infrared region, and mid-infrared range semiconductor light-receiving elements which detect light with wavelengths in the mid-infrared region are known. For example, mid-infrared emission semiconductor light-emitting elements are widely used in the applications such as sensors and gas analysis.

When the reception or emission wavelengths of such a semiconductor optical device are 1.7 μm to 12 μm in the mid-infrared region, typically, a substrate made of a compound semiconductor such as GaAs, InP, InAs, GaSb, or InSb that are given in descending order of their lattice constant is used as a growth substrate, and a combination of mixed crystals of those compounds is epitaxially grown on the growth substrate. Of substrates of those compounds, InAs, GaSb, and InSb compound substrates have a lattice constant approximate to that of light emitting layers for the mid-infrared region of 1.7 μm to 12 μm. Accordingly, it has been considered that InAs, GaSb, or InSb would be preferably used for a growth substrate of a semiconductor optical device for the mid-infrared region.

For example, in JP 2015-534270 A (PTL 1), for example, after an InSbP barrier layer is formed on an InAs substrate, an InAsSbP active layer is formed. Alternatively, after an InAsSb active layer is formed on an InAs substrate, an InSbP barrier layer is formed. In PTL 1, a conductive InAs substrate is used as is in a light-emitting diode for wavelengths of 2.6 μm to 4.7 μm.

CITATION LIST

Patent Literature

PTL 1: JP 2015-534270 A

SUMMARY

Technical Problem

In recent years, in order to enhance the performance of sensors, gas analyzer systems, and the like, mid-infrared light-emitting elements are required to have improved wall-plug efficiency (WPE); the wall-plug efficiency is light emission efficiency corresponding to the ratio of the light output power to the total electrical input power.

It could therefore be helpful to provide, of semiconductor optical devices, a light-emitting element that has InAsSb as a light emitting layer and exhibits improved light emission efficiency, and a method of producing the same.

Solution to Problem

The present inventor diligently studied ways to address the above challenge and contemplated providing an AlInAs electron blocking layer between an active layer and a p-type InAs layer. Specifically, this disclosure primarily includes the following features.

(1) A light-emitting element comprising a semiconductor laminate including, in the following order:
- a first InAs layer that is undoped or doped with an n-type dopant;
- an active layer including one or more $InAs_ySb_{1-y}$ layers where $0<y<1$;
- an $Al_xIn_{1-x}As$ electron blocking layer with a thickness of 5 nm to 40 nm, where $0.05 \leq x \leq 0.4$; and
- a second InAs layer doped with a p-type dopant.

(2) The light-emitting element according to (1) above, wherein the active layer further includes $InAs_zP_{1-z}$ layers where $0<z<1$, and the active layer has a quantum well structure in which the $InAs_ySb_{1-y}$ layers are well layers and the $InAs_zP_{1-z}$ layers are barrier layers.

(3) The light-emitting element according to (1) or (2) above, wherein an emission peak wavelength of light emitted from the active layer is 3.4 μm or more.

(4) The light-emitting element according to any one of (1) to (3) above, wherein the $Al_xIn_{1-x}As$ electron blocking layer is doped with a Zn dopant.

(5) The light-emitting element according to any one of (1) to (4) above, comprising:
- a support substrate;
- a metal bonding layer provided on a surface of the support substrate;
- a distribution portion including a transparent insulating layer having a through hole and an ohmic electrode portion provided in the through hole, the distribution portion being provided on the metal bonding layer; and
- the semiconductor laminate provided on the distribution portion.

(6) A method of producing the light-emitting element according to (1) above, comprising:
- a step of forming the first InAs layer;
- a step of forming the active layer on the first InAs layer;
- a step of forming $Al_xIn_{1-x}As$ electron blocking layer on the active layer; and
- a step of forming the second InAs layer on the $Al_xIn_{1-x}As$ electron blocking layer.

(7) A method of producing the light-emitting element according to (1) above, comprising:
- a step of forming the second InAs layer;
- a step of forming the $Al_xIn_{1-x}As$ electron blocking layer on the second InAs layer;
- a step of forming the active layer on the $Al_xIn_{1-x}As$ electron blocking layer; and
- a step of forming the first InAs layer on the active layer.

Advantageous Effect

This disclosure can provide a light-emitting element that exhibits improved light emission efficiency, and a method of producing the same.

BRIEF DESCRIPTION OF THE DRAWINGS

In the accompanying drawings:

FIG. 4 is a cross-sectional schematic view illustrating an example of a method of producing a light-emitting element, according to Embodiment 2 of this disclosure;

FIG. 5 is a cross-sectional schematic view illustrating the example of a production method, subsequent to the step in FIG. 4;

FIG. 6 is a cross-sectional schematic view illustrating the example of a production method, subsequent to the step in FIG. 5;

DETAILED DESCRIPTION

Figure 1:
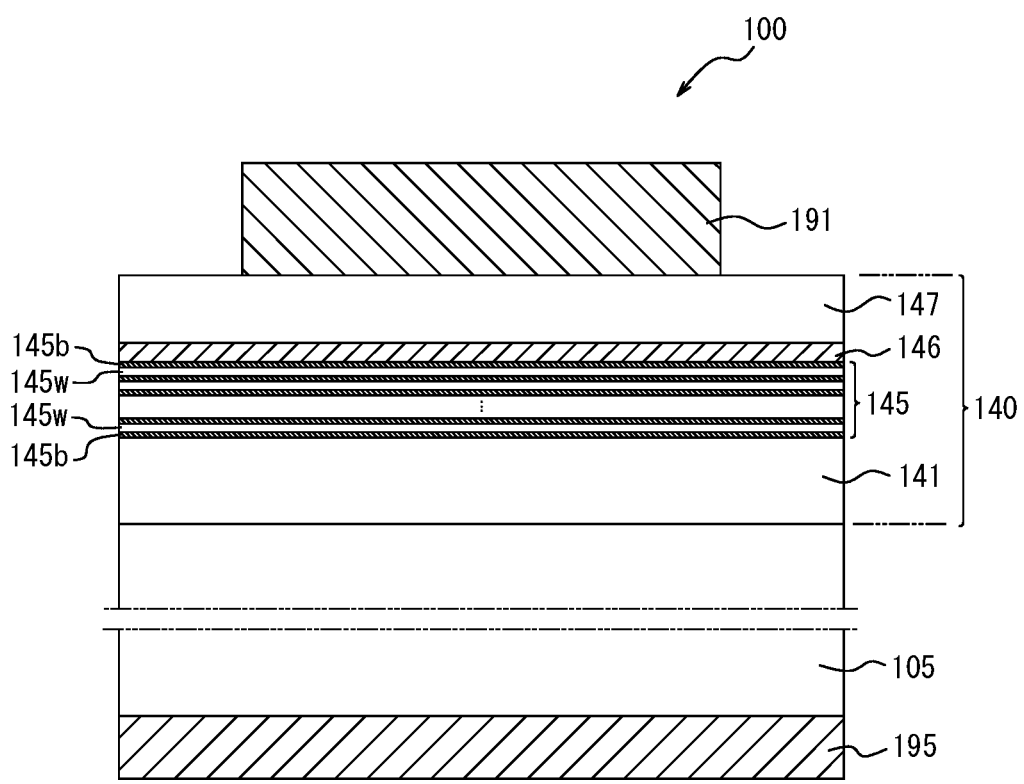
FIG. 1 is a cross-sectional schematic view illustrating a light-emitting element according to Embodiment 1 of this disclosure.

Prior to describing embodiments of this disclosure, the following points are described beforehand.

<Composition and Thickness>

First, in this specification, the chemical composition ratios of the group III-V elements of AlInGaAsSbP can be found for example by a photoluminescence measurement or an X-ray diffraction measurement. Further, the total thickness of the layers formed can be found by observing a cross section of the layers using a scanning electron microscope or a transmission electron microscope. Moreover, the thickness of each layer can be found by observing a cross section of the grown layer using a transmission electron microscope. When the thickness of each layer is small as in a quantum well structure, the thickness and the composition ratio of each layer can be measured using TEM-EDS. Note that when a given layer has an inclined surface in a cross-sectional view, the thickness of the layer is defined by the maximum height of the layer from a flat surface of the underlying layer.

When specific III elements or V elements are removed from an expression "AlInGaAsSbP", the III elements or V elements removed are not contained in the composition except for ones inevitably mixed due to for example diffusion from adjacent layers or elements left in an epitaxial growth apparatus.

<p-Type, n-Type, and Undoped; and Dopant Concentration>

In this specification, a layer that is obtained by adding impurities and serves as an electrically p-type layer is referred to as a p-type semiconductor layer, and a layer that is obtained by adding impurities and serves as an electrically n-type layer is referred to as an n-type semiconductor layer. On the other hand, when a layer is not deliberately doped with impurities such as Si, Zn, S, Sn, Mg, or Te, the layer is described as being "undoped". Specifically, when a layer has a low dopant concentration (for example, less than $5 \times 10^{16}$ atoms/cm$^3$) of the above specific impurities that would not be mixed in unless they are deliberately added, the layer is treated as being "undoped" in this specification. Further, a III-V compound semiconductor layer that is not deliberately doped with impurities but contains $5 \times 10^{16}$ atoms/cm$^3$ or more unavoidable impurities (such as O, C, or H) associated with decomposition of a source gas in the production process is also treated as being undoped. It should be noted that since InAs serves as an electrically n-type semiconductor even when undoped, either an undoped InAs layer or an InAs layer doped with an n-type dopant serves as an n-type layer.

Further, the values of the impurity concentrations of Zn, Te, etc. are determined by SIMS analysis. Note that since the value of the dopant concentration greatly varies in the vicinity of the boundaries between semiconductor layers, the value of the dopant concentration is found as the value of the dopant concentration at the center in the thickness direction of each layer.

Referring to the drawings, a light-emitting element according to this disclosure and a method of producing the same will now be described in succession. In principle, like components are denoted by three digit numbers having the same last two digits, and the description will not be repeated. A substrate and layers in each drawing are exaggerated in thickness for convenience of illustration, so that the ratio between the vertical and horizontal dimensions of each illustrated component does not conform to the actual ratio.

Embodiment 1

Referring to FIG. 1, a light-emitting element 100 according to a first embodiment of this disclosure is described. The light-emitting element 100 includes at least a semiconductor laminate 140 having a first InAs layer 141 that is undoped or doped with an n-type dopant, an active layer 145 including one or more InAs$_y$Sb$_{1-y}$ layers 145w (0<y<1), an Al$_x$In$_{1-x}$As electron blocking layer 146 (0.05≤x≤0.4) with a thickness of 5 nm to 40 nm, and a second InAs layer 147 doped with a p-type dopant, in this order. In FIG. 1, a top electrode 191 is provided on the second InAs layer 147 in the semiconductor laminate 140, and the semiconductor laminate 140 is provided on a substrate 105. Further, a bottom electrode 195 is provided on the rear surface of the substrate 105.

<Substrate>

Now, the substrate 105 is a substrate having a thickness such that the shape of the semiconductor laminate 140 including the active layer 145 can be mechanically maintained, and may be a growth substrate to be used for epitaxial growth in forming the semiconductor laminate 140 of the light-emitting element 100; alternatively, as in a light-emitting element 200 of a different example to be described with reference to FIG. 2 and FIG. 3, a support substrate 280 different from an InAs growth substrate 210 may be used. As a growth substrate, a substrate of a compound such as GaAs, InP, InAs, GaSb, InSb, or the like can be used, and an InAs substrate is preferably used to form the first InAs layer 141 and the second InAs layer 147. A support substrate is preferably less expensive and more thermally conductive than the growth substrate; for example, the support substrate may use a substrate of a compound such as Si, Ge, GaAs, and the like; a metal substrate using a metal that can reduce the thermal expansion coefficient, such as a copper alloy or molybdenum, tungsten, KOVAR (Fe-29Ni-17Co), or the like; or a submount substrate obtained by attaching a metal to a ceramic substrate of, for example, AlN.

<Active Layer>

The active layer 145 includes one or more $InAs_ySb_{1-y}$ layers 145w (0<y<1), and the $InAs_ySb_{1-y}$ layers form a light emitting layer. In FIG. 1, the active layer further has $InAs_zP_{1-z}$ layers 145b (0<z<1), and a quantum well structure in which the $InAs_ySb_{1-y}$ layers 145w are well layers and the $InAs_zP_{1-z}$ layers 145b are barrier layers is depicted for illustrative purposes; however, the active layer 145 may have a single layer structure of the $InAs_ySb_{1-y}$ layer. Nevertheless, it is preferred that the active layer 145 has a multiple quantum well (MQW) structure as in FIG. 1 in order to enhance the light output power by reducing crystal defects. The multiple quantum-well structure can be formed with the structure in which the well layers and the barrier layers are placed alternately and repeatedly.

—Composition of Active Layer and Emission Peak Wavelength—

The As composition ratio y of the $InAs_ySb_{1-y}$ layers 145w serving as well layer preferably satisfies $0.7 \leq y<1.0$, and more preferably satisfies $0.80 \leq y \leq 0.95$. On the other hand, the As composition ratio z of the $InAs_zP_{1-z}$ layers 145b serving as barrier layers preferably satisfies $0.50 \leq z<1$, and more preferably satisfies $0.8 \leq z \leq 0.95$. In the case of the quantum well structure, in addition to altering the composition, adjusting the difference between the composition ratios between the well layers 145w and the barrier layers 145b to add strain in the well layers is also preferred. The composition alteration of the active layer 145 allows the light-emitting element 100 to have an emission peak wavelength of 1700 nm to 12000 nm (1.7 μm to 12 μm). The emission peak wavelength of the light-emitting element 100 may be 3.1 μm or more, preferably 3.4 μm or more.

<AlInAs Electron Blocking Layer>

The light emission efficiency can be improved by providing an $Al_xIn_{1-x}As$ electron blocking layer 146 ($0.05 \leq x \leq 0.40$) with a thickness of 5 nm to 40 nm between the active layer 145 and the second InAs layer 147 in the light-emitting element 100.

—Al Composition Ratio x—

The Al composition ratio x of the $Al_xIn_{1-x}As$ electron blocking layer 146 is 0.05 or more and 0.40 or less, preferably 0.10 or more and 0.35 or less. When the Al composition ratio x is higher than 0.40, the forward voltage would be increased, thus reducing the light emission efficiency; whereas when the Al composition ratio x is lower than 0.05, the light emission efficiency improving effect of the electron blocking layer may not be obtained.

—Thickness—

The thickness of the $Al_xIn_{1-x}As$ electron blocking layer 146 is 5 nm to 40 nm, preferably 10 nm to 35 nm. A thickness of 40 nm would increase the forward voltage, thus reducing the light emission efficiency; whereas a thickness of less than 5 nm would fail to obtain the light emission efficiency improving effect of the electron blocking layer.

—Dopant—

The $Al_xIn_{1-x}As$ electron blocking layer may be undoped, or may be doped with a p-type dopant. Comparing the undoped layer and the layer doped with a p-type dopant, the layer doped with a p-type dopant had a greater light emission efficiency improving effect and is preferred. The p-type dopant is particularly preferably Zn. Note that when the impurity concentration of the p-type dopant measured by SIMS analysis is $1 \times 10^{18}$ atoms/cm$^3$ or more and $8 \times 10^{18}$ atoms/cm$^3$ or less, an even greater light emission efficiency improving effect can be ensured to be obtained, and the impurity concentration is preferably $2 \times 10^{18}$ atoms/cm$^3$ or more.

A specific aspect applicable to the light-emitting element 100 will now be described in more detail.

<<InAs Growth Substrate>>

As an InAs growth substrate that can be suitably used as the substrate 105 may use a commercially available n-type InAs substrate or an undoped InAs substrate. Alternatively, a p-type InAs substrate may be used, in which case, unlike in FIG. 1, the second InAs layer 147, the $Al_xIn_{1-x}As$ electron blocking layer 146, the active layer 145, and the first InAs layer 141 are provided in this order from the side opposite to the substrate 105.

<<Semiconductor Laminate>>

The semiconductor laminate 140 may have a double hetero (DH) structure in which the active layer 145 is sandwiched between the first InAs layer 141 and the second InAs layer 147. Note that FIG. 1 illustrates the substrate 105 serving as a growth substrate and the first InAs layer 141 separately for convenience; however, if the growth substrate is undoped or n-type, the growth substrate may be used as it is as the first InAs layer 141. The semiconductor laminate 140 can improve the light emission efficiency by including the $Al_xIn_{1-x}As$ electron blocking layer 146 as described above.

When the InAs growth substrate for epitaxially growing the semiconductor layers of the semiconductor laminate 140 is n-type or undoped, the light-emitting element 100 can be produced through a step of forming the first InAs layer 141, a step of forming the active layer 145 on the first InAs layer 141, a step of forming the $Al_xIn_{1-x}As$ electron blocking layer 146 on the active layer 145, and a step of forming the second InAs layer 147 on the $Al_xIn_{1-x}As$ electron blocking layer 146. On the other hand, when the InAs growth substrate for epitaxially growing the semiconductor layers of the semiconductor laminate 140 is p-type, the light-emitting element can be produced through a step of forming the second InAs layer 147, a step of forming the $Al_xIn_{1-x}As$ electron blocking layer 146 on the second InAs layer 147, a step of forming the active layer 145 on the $Al_xIn_{1-x}As$ electron blocking layer 146, and a step of forming the first InAs layer 141 on the active layer 145.

—Method of Growing Semiconductor Laminate—

The semiconductor layers can be formed by epitaxial growth, and can be formed by a known thin film deposition technique, for example, by metalorganic chemical vapor deposition (MOCVD), or molecular beam epitaxy (MBE). For example, trimethylindium (TMIn) may be used as an In source; trimethylgallium (TMGa) or triethylgallium (TEGa) as a Ga source; trimethylaluminum (TMAl) as an Al source; arsine (AsH$_3$) or tertiary butyl arsine (TBAs) as an As source; trimethylantimony (TMSb), triethylantimony (TESb), or trisdimethylaminoantimony (TDMASb) as a Sb source; and phosphine (PH$_3$) or tertiary butylphosphine (TBP) as a P source, at a predetermined mixing ratio, and these source gases may be subjected to vapor phase epitaxy using a carrier gas to form the layers having a desired thickness by controlling the growth time. When the layers are p-type or n-type doped, a dopant source gas as desired can be used in addition. For example, when Zn doping is performed, a diethylzinc (DEZn) gas or the like may be used. Note that as described above, even when undoped, InAs becomes n-type.

—Other Semiconductor Layers of Semiconductor Laminate—

Further, although not illustrated, it is also preferred that the semiconductor laminate 140 further includes a contact layer on the side of the second InAs layer 147 opposite to the active layer 145 (that is, on the side where the top electrode 191 depicted in FIG. 1 is formed); the contact layer can reduce the resistance between the semiconductor laminate 140 and the electrode. Further, the semiconductor laminate 140 may include an undoped spacer layer (for example, an undoped InAs layer) each between the first InAs layer 141 and the active layer 145 or between the active layer 145 and the $Al_xIn_{1-x}As$ electron blocking layer.

—Thickness of Semiconductor Laminate—

The total thickness of the semiconductor laminate 140 may be for example, but not limited to, 2 μm to 8 μm. Further, the thickness of the first InAs layer 141 may be for example, but not limited to, 0.1 μm to 5 μm. Further, the thickness of the active layer 145 may be for example, but not limited to, 3 nm to 3000 nm. The thickness of the second InAs layer 147 may be for example, but not limited to, 0.1 μm to 3 μm. When the active layer 145 has a quantum well structure, the thickness of the $InAs_ySb_{1-y}$ layers 145w being well layers may be 3 nm to 20 nm, and the thickness of the $InAs_zP_{1-z}$ layers 145b being barrier layers may be 5 nm to 50 nm. The number of pairs of the two layers may be 1 to 50.5. Note that when a barrier layer is first formed, and N pairs (N is an integer) of well layers and barrier layers are then stacked in an alternate manner, the layers are described as being formed in total N.5 pairs.

—Electrode—

Further, as illustrated in FIG. 1, the top electrode 191 may be formed on the semiconductor laminate 140 (on the second InAs layer 147 in FIG. 1), and the bottom electrode 195 may be formed on the rear surface of the substrate 105. The top electrode 191 may include a wiring portion and a pad portion. Although not illustrated, the pad portion may be formed by attaching a metal layer for bonding or a solder to an ohmic electrode. The metal materials and the method for forming the top electrode 191 and the bottom electrode 195 may use well-known ones. As the metal materials, Ti, Pt, Au, Ag, Al, Zn, Ni, etc. can be used, and the formation method may be, for example, sputtering, electron-beam physical vapor deposition, resistance heating, etc. used in combination with, for example, photolithography or a metal mask.

Embodiment 2

Figure 2:
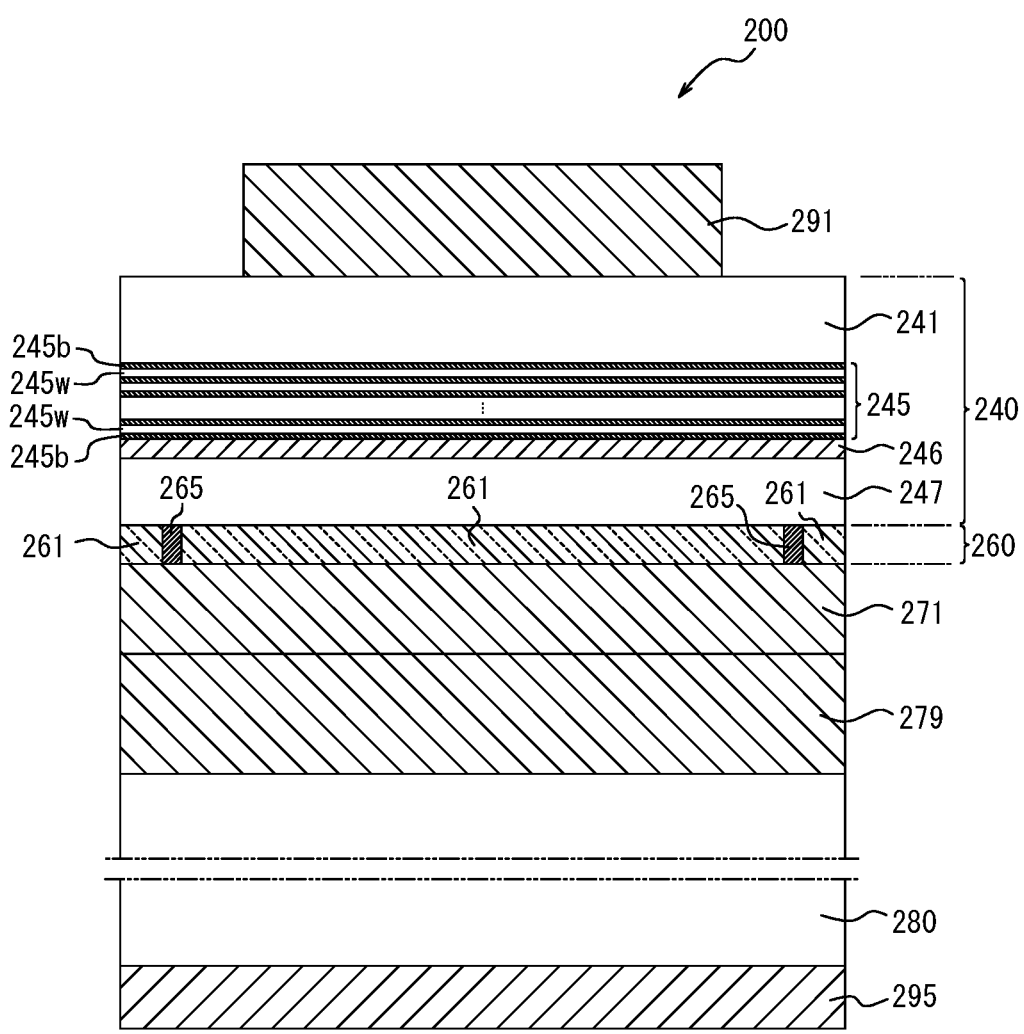
FIG. 2 is a cross-sectional schematic view illustrating a light-emitting element according to Embodiment 2 of this disclosure.
Figure 3:
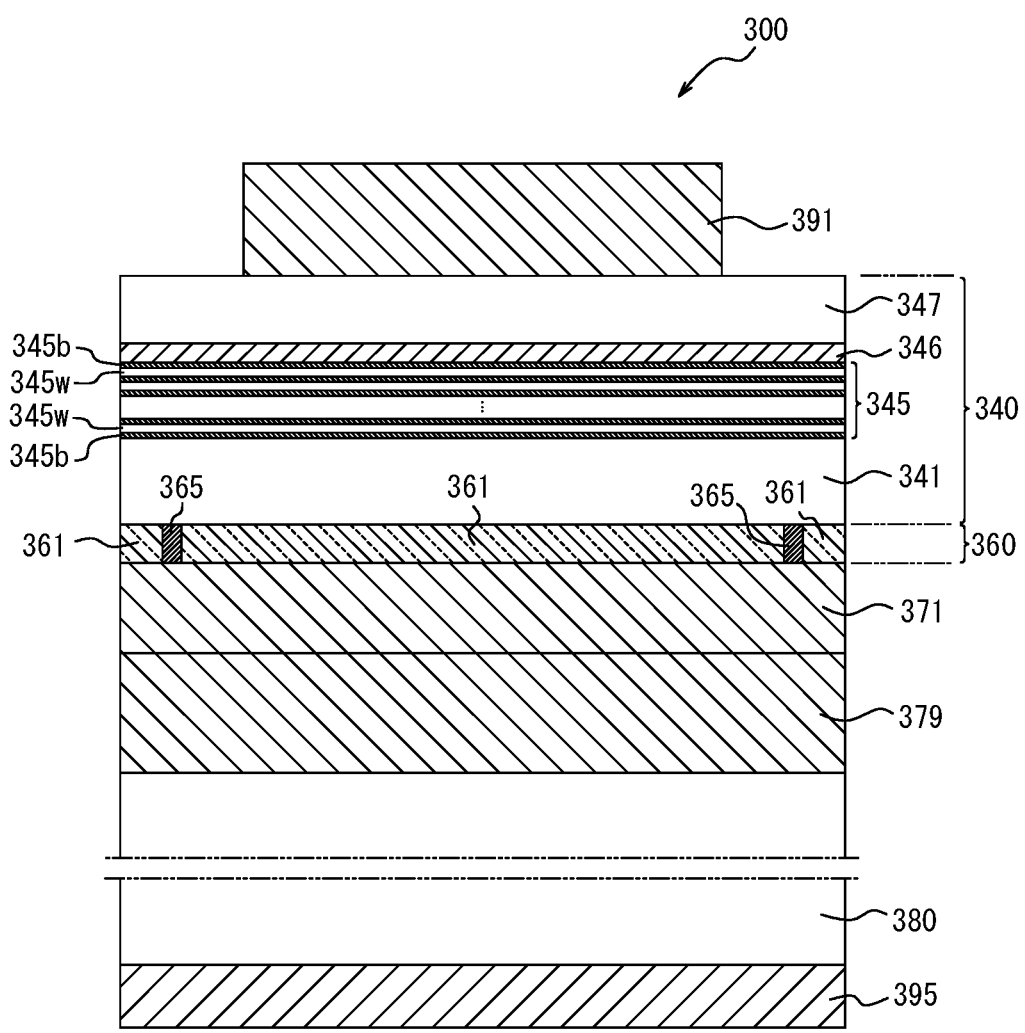
FIG. 3 is a cross-sectional schematic view illustrating a light-emitting element according to a variation of Embodiment 2 of this disclosure.

Referring to FIG. 2, a light-emitting element 200 according to a second embodiment of this disclosure is described. The light-emitting element 200 is a bonded light-emitting element obtained by bonding a support substrate and removing the growth substrate after that. As described above, like components of the light-emitting element 100 and the light-emitting element 200 are denoted by three digit numbers having the same last two digits, and the description will not be repeated. The light-emitting element 200 includes at least a support substrate 280; a metal bonding layer 279 on a surface of the support substrate 280; a distribution portion 260 including a transparent insulating layer 261 having a through hole and an ohmic electrode portion 265 provided in the through hole, on the metal bonding layer 279; and a semiconductor laminate 240 provided on the distribution portion 260. The semiconductor laminate 240 of the light-emitting element 200 has a first InAs layer 241, an active layer 245, an $Al_xIn_{1-x}As$ electron blocking layer 246, and a second InAs layer 247 in this order from the side opposite to the support substrate 280 . . . . As in a light-emitting element 300 depicted in FIG. 3, a semiconductor laminate 340 may have a first InAs layer 341, an active layer 345, an $Al_xIn_{1-x}As$ electron blocking layer 346, and a second InAs layer 347 in this order from the support substrate 380 side.

Reference is made back to FIG. 2. Also in this embodiment of a bonded-type where the bonding support substrate 280 is formed and the InAs growth substrate 210 (see FIG. 4) is removed after that, the light emission efficiency can be improved by providing an $Al_xIn_{1-x}As$ electron blocking layer 246 (0.05≤x≤0.4) with a thickness of 5 nm to 40 nm between the active layer 245 and the second InAs layer 247. An example of an embodiment of a method of producing the light-emitting element 200 will now be described in more detail with reference to FIG. 4 to FIG. 15.

Referring to FIG. 4, the InAs growth substrate 210 is first prepared. Subsequently, referring to FIG. 5, an initial buffer layer 220 made of InAs is formed on the InAs growth substrate 210, and an etching stop layer 230 made of a GaAsSb-based III-V compound semiconductor containing at least Ga and Sb is then formed thereon. The formation of the initial buffer layer 220 may be omitted.

<Formation of Etching Stop Layer>

The etching stop layer 230 is a semiconductor layer that displays a sufficiently low etch rate in an etchant (for example, concentrated hydrochloric acid with a concentration of 8 M (mol/L) or more) used in etching the InAs growth substrate 210, and is insoluble in the etchant until the InAs growth substrate 210 is completely removed. Further, the etching stop layer 230 has a lattice constant such that it can be grown on the InAs growth substrate 210.

The composition of the GaAsSb-based III-V compound semiconductor of the etching stop layer 230 is expressed as $GaAs_xESb_{1-x}E$, where the As composition ratio is $x_E$. The As composition ratio $x_E$ preferably satisfies $0 \le x_E \le 0.4$. An As composition ratio $x_E$ of more than 0.4 would allow for etching even with the above etchant, and an As composition ratio $x_E$ satisfying the above range allows the etching stop layer to be epitaxially grown on the InAs growth substrate 210 with the etching stop layer being insoluble in the above etchant. More preferably $0.02 \le x_E \le 0.13$. An As composition ratio $x_E$ within this range can reduce the difference in lattice constant from the InAs growth substrate 210. It is also preferred that, as illustrated in FIG. 5, the etching stop layer 230 has a superlattice structure in which two GaAsSb-based III-V compound semiconductors 230a and 230b having different As composition ratios are repeatedly stacked.

<Formation of Semiconductor Laminate>

Next, referring to FIG. 6, the semiconductor laminate 240 is formed on the etching stop layer 230. As with the semiconductor laminate 140 described above, the spacer layers and the contact layer mentioned above may be formed in forming the semiconductor laminate 240.

<Formation of Distribution Portion>

Figure 7:
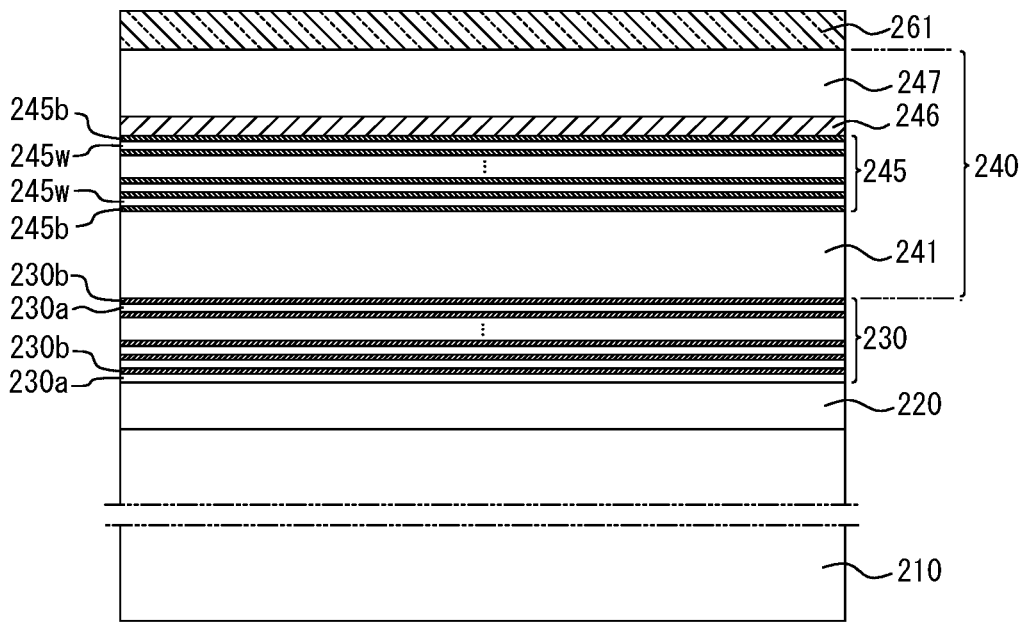
FIG. 7 is a cross-sectional schematic view illustrating the example of a production method, subsequent to the step in FIG. 6.

Reference is made to FIG. 7. The distribution portion 260 (FIG. 9) including a transparent insulating layer 261 (FIG. 8) having a through hole 261A and an ohmic electrode portion 265 provided in the through hole 261A is formed on the second InAs layer 247 (on the contact layer when a contact layer is provided in addition). The method of forming the distribution portion 260 may use any technique, and an example of a specific manner of forming the distribution portion 260 is described with reference to FIG. 7 to FIG. 9.

Figure 8:
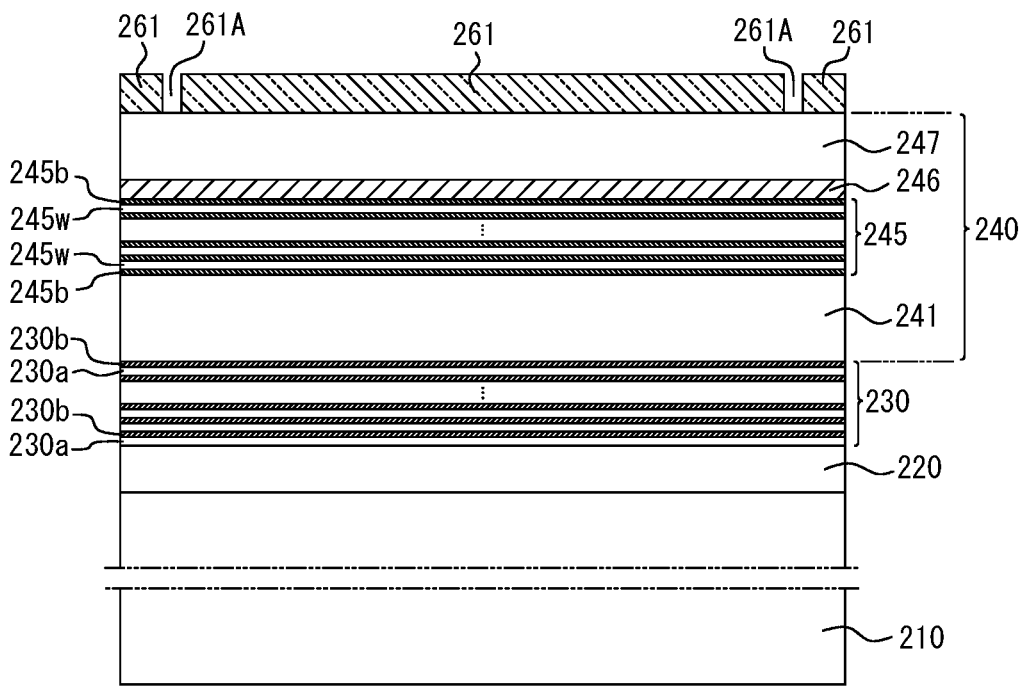
FIG. 8 is a cross-sectional schematic view illustrating the example of a production method, subsequent to the step in FIG. 7.
Figure 9:
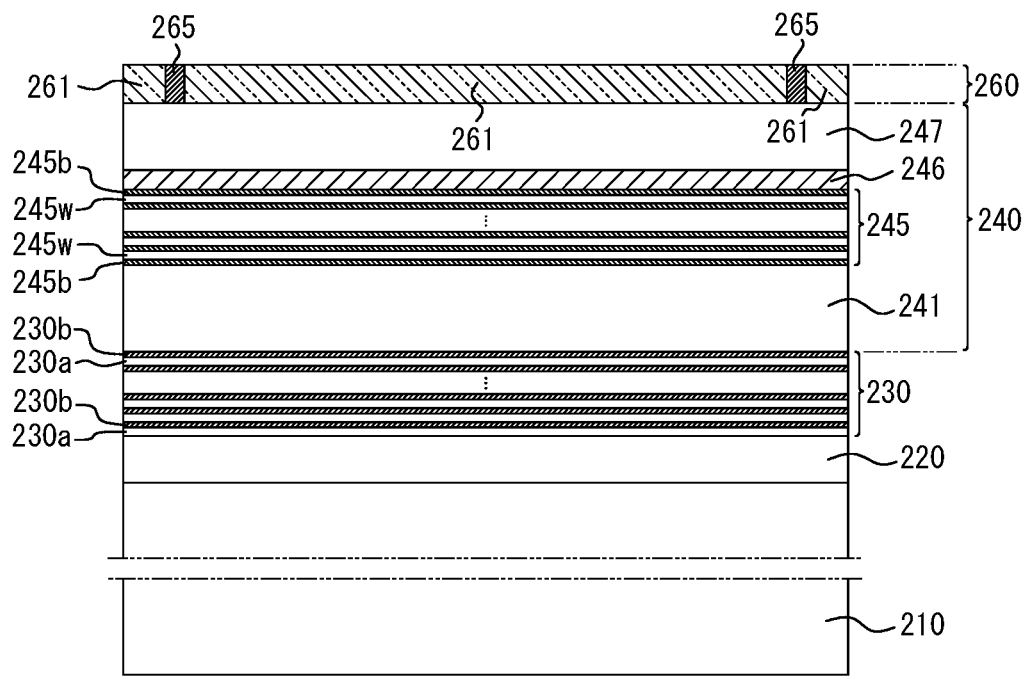
FIG. 9 is a cross-sectional schematic view illustrating the example of a production method, subsequent to the step in FIG. 8.

First, the transparent insulating layer 261 is deposited on the semiconductor laminate 240 (FIG. 7). For the method of deposition, a known technique such as plasma CVD or sputtering can be used. After that, a resist pattern is formed on the transparent insulating layer 261 using a photomask. Next, the transparent insulating layer 261 is partly removed by etching using the resist pattern to form the through hole 261A (FIG. 8). The provision of the through hole 261A exposes part of the outermost surface of the semiconductor laminate 240. After that, the ohmic electrode portion 265 is formed by deposition over a resist pattern and subsequent lift-off using the resist pattern, thus the distribution portion 260 can be formed (FIG. 9). In the distribution portion 260, parts of the transparent insulating layer 261 and the ohmic electrode portion 265 are arranged in parallel. Note that the same resist pattern may be used in etching the transparent insulating layer 261 and in the lift-off for the ohmic electrode portion 265; alternatively, a different resist pattern may be formed. It should be noted that in the drawings, the ohmic electrode portion fills the through hole 261A for convenience of illustration; however, this is not restrictive. Although not illustrated, gaps may be formed between the transparent insulating layer 261 and the ohmic electrode portion because etching using a combination of resist patterns or a resist pattern propagates to areas covered with the resist pattern(s), and that is acceptable.

Figure 14:
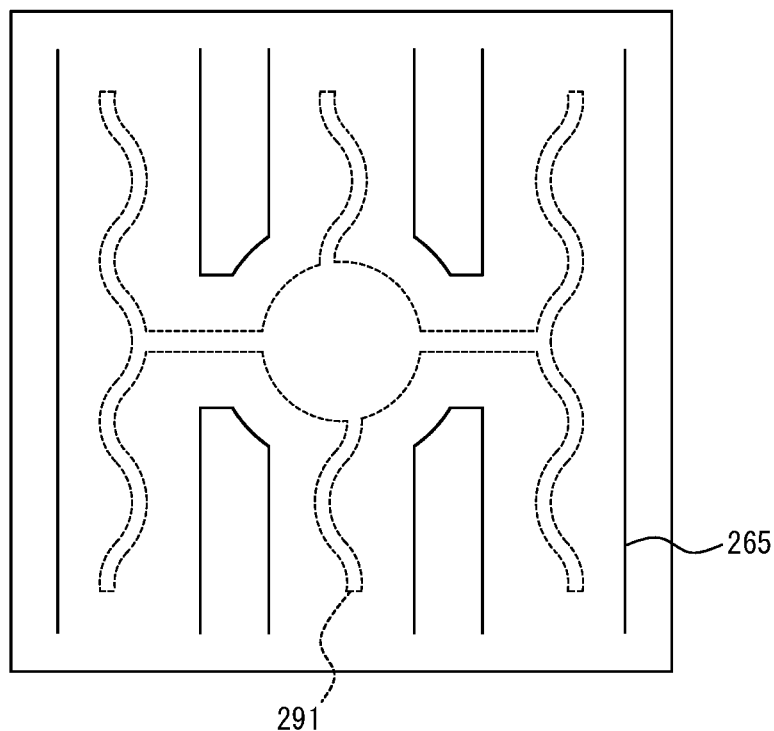
FIG. 14 is a schematic plan view illustrating an example of the shape and the placement of an ohmic electrode portion after fabricating a distribution portion in Embodiment 2.

The ohmic electrode portion 265 can be formed into islands distributed in a predetermined pattern. An example of the pattern of the ohmic electrode portion 265 in this embodiment is illustrated in FIG. 14. In FIG. 14, an example of the pattern of a top electrode 291 to be described is indicated by the broken lines. For example, Au, AuZn, AuBe, AuTi, etc. can be used as the ohmic electrode portion 265, and a structure in which those materials are stacked can preferably be used as the ohmic electrode portion 265. For example, Ti/Au may be used as the ohmic electrode portion 265. The thickness (or the total thickness) of the ohmic electrode portion 265 may be for example, but not limited to 300 nm to 1300 nm, preferably 350 nm to 800 nm.

Although not illustrated, the relation between the thickness $H_1$ of the transparent insulating layer 261 and the thickness $H_2$ of the ohmic electrode portion 265 may be $H_1 > H_2$ or may preferably be $H_1 > H_2$. Under these conditions, the thickness of the transparent insulating layer 261 may be for example, but not limited to, 360 nm to 1600 nm, more preferably 410 nm to 1100 nm. Further, it is also preferred that the difference between the thickness $H_1$ of the transparent insulating layer 261 and the thickness $H_2$ of the ohmic electrode portion 265: $H_1$-$H_2$ is 10 nm or more and 100 nm or less. Moreover, when a contact layer is additionally provided as described above, the contact layer may be formed to remain only in the through hole 261A, in which case, the total thickness of the contact layer and the ohmic electrode portion may be the thickness $H_2$.

Further, the transparent insulating layer 261 may use $SiO_2$, SiN, ITO, $Al_2O_3$, AlN, etc., and the transparent insulating layer 261 is preferably made of $SiO_2$ in particular. $SiO_2$ can easily be treated by etching using for example BHF.

<Formation of Metal Reflective Layer>

Figure 10:
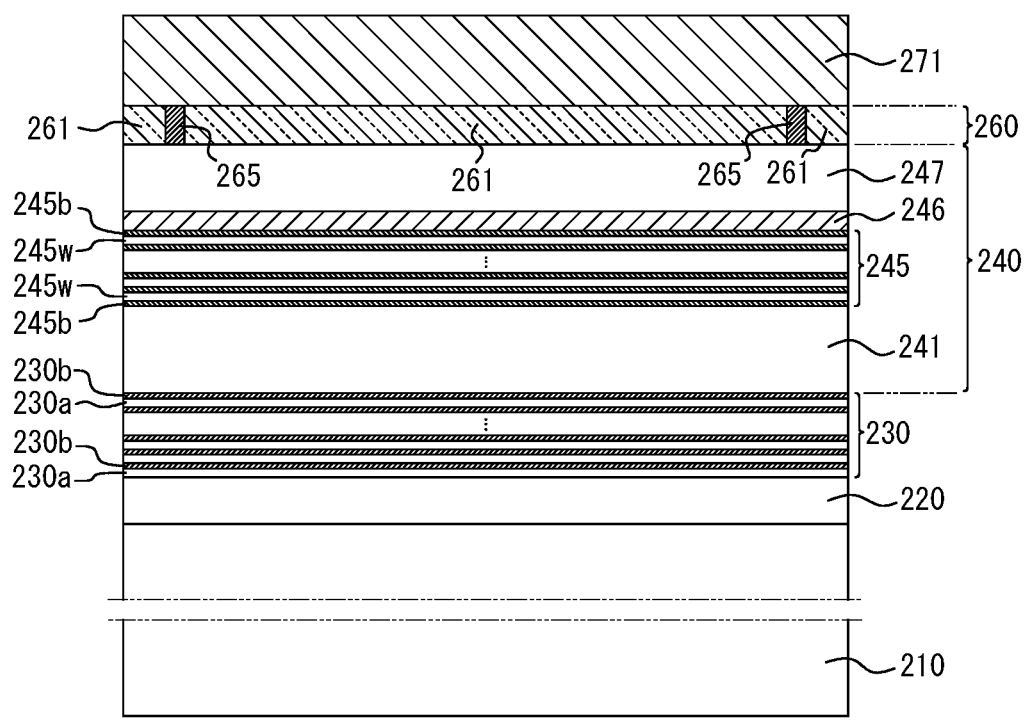
FIG. 10 is a cross-sectional schematic view illustrating the example of a production method, subsequent to the step in FIG. 9.

As illustrated in FIG. 10, a metal reflective layer 271 may preferably be formed on the distribution portion 260. The metal reflective layer 271 may include a plurality of metal layers. Al, Pt, Ti, Ag, etc. in addition to Au may be used as metals forming the metal reflective layer 271. For example, the metal reflective layer 271 may be constituted by a single layer made of Au alone; alternatively, the metal reflective layer 271 may include two or more Au metal layers. The metal reflective layer 271 preferably contains 50% by mass or more Au in the composition of the metal reflective layer 271. To ensure to perform bonding with the metal bonding layer 279 in the subsequent step, the outermost surface layer of the metal reflective layer 271 (the surface opposite to the semiconductor laminate 240) is preferably an Au metal layer.

For example, metal layers of Al, Au, Pt, and Au may be deposited in this order on the distribution portion 260 (including gaps when the above gaps are formed) to form the metal reflective layer 271. The thickness of one Au metal layer in the metal reflective layer 271 may be for example 400 nm to 2000 nm, and the thickness of each metal layer made of a metal other than Au may be for example 5 nm to 200 nm. The metal reflective layer 271 can be formed by deposition using a typical technique such as vapor deposition.

<Bonding with Support Substrate>

Figure 11:
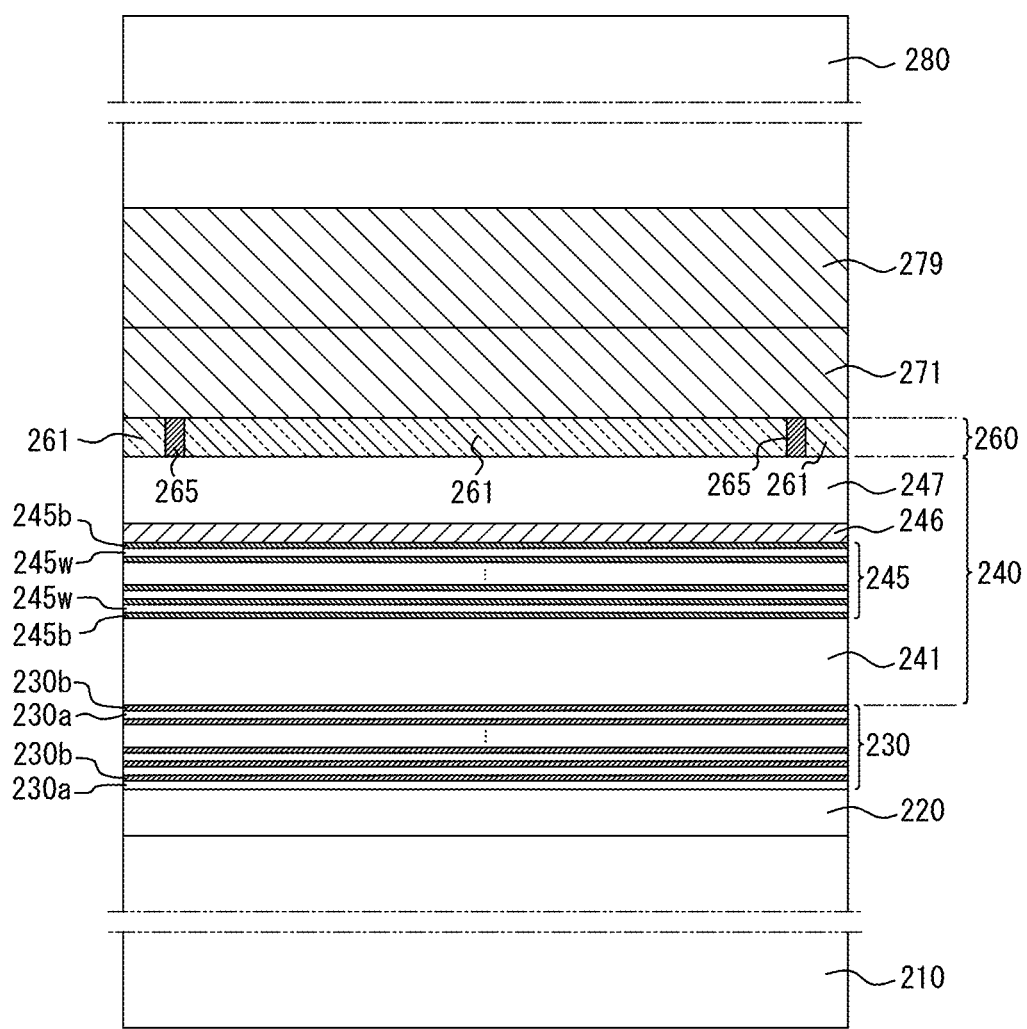
FIG. 11 is a cross-sectional schematic view illustrating the example of a production method, subsequent to the step in FIG. 10.

Referring to FIG. 11, the semiconductor laminate 240 and the distribution portion 260 are bonded to the support substrate 280 with at least a metal bonding layer 279 therebetween. When the metal reflective layer 271 is provided, the metal reflective layer 271 and the metal bonding layer 279 may be bonded together. The metal bonding layer 279 and the metal reflective layer 271 are placed to face each other and put together, followed by bonding of the layers by thermocompression bonding at temperatures of approximately 250° C. to 500° C.

<<Metal Bonding Layer>>

Metals such as Ti, Pt, and Au; and metals forming a eutectic alloy with Au (for example, Sn); or a solder may be used to form the metal bonding layer 279. Layers of such metals are preferably stacked to form the metal bonding layer 279. For example, Ti with a thickness of 400 nm to 800 nm, Pt with a thickness of 5 nm to 20 nm, and Au with a thickness of 700 nm to 1200 nm can be stacked in this order on the surface of the support substrate 280 to form the metal bonding layer 279. For example, when the reflective layer 271 and the metal bonding layer 279 are bonded together, an Au metal layer is provided as the outermost surface layer of the metal bonding layer 279, and Au is also provided as the outermost surface layer of the metal reflective layer 271 to perform bonding of Au and Au by Au—Au diffusion bonding.

<<Support Substrate>>

The support substrate 280 is a substrate made of a different material from the InAs growth substrate 210 and can use a semiconductor substrate, a metal substrate, or a submount substrate based on a ceramic substrate, as mentioned above. Since the above-described bonding process is used, the support substrate 280 is allowed to have a lattice mismatch with the semiconductor layers formed in this embodiment. Although the support substrate 280 may be insulating depending on use, it is preferably a conductive substrate. In terms of workability and cost, a Si substrate is preferably used as the support substrate 280. The use of a Si substrate can significantly reduce the thickness of the support substrate 280 compared with that of conventional support substrates, and such a substrate is suitable for packaging in combination with various semiconductor devices. Further, a Si substrate is also more advantageous than an InAs substrate also in terms of heat dissipation.

<<Removal of InAs Growth Substrate>>

Figure 12:
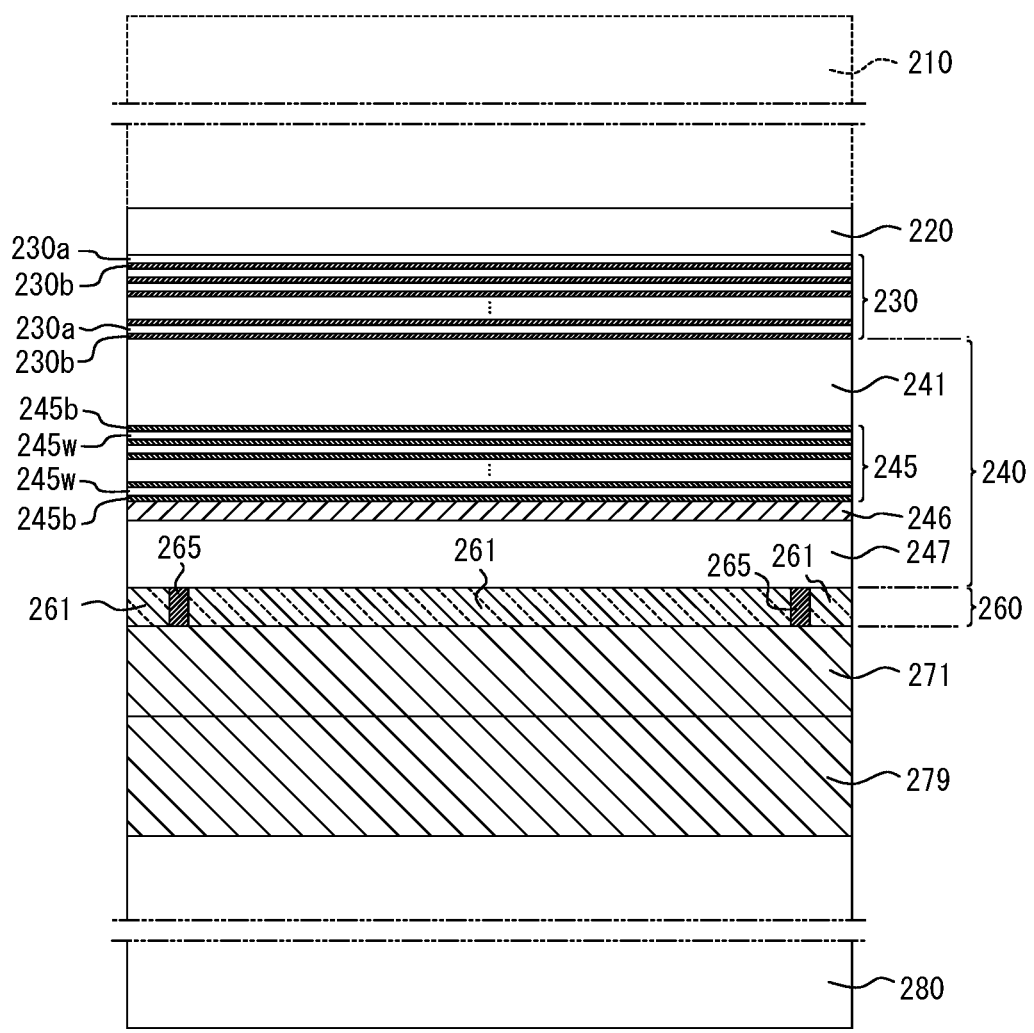
FIG. 12 is a cross-sectional schematic view illustrating the example of a production method, subsequent to the step in FIG. 11.
Figure 13:
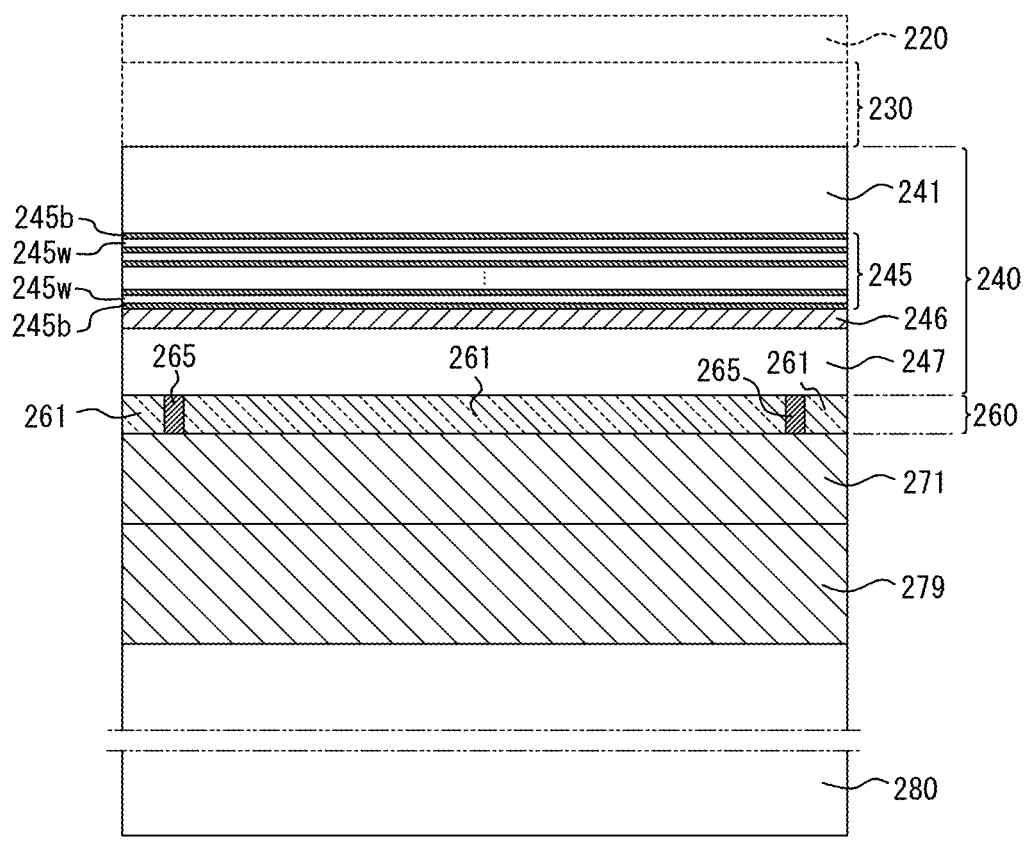
FIG. 13 is a cross-sectional schematic view illustrating the example of a production method, subsequent to the step in FIG. 12.

Referring to FIG. 12, after the support substrate 280 is bonded, the InAs growth substrate 210 is removed. The InAs growth substrate 210 may be removed using the etching stop layer 230 by etching the InAs growth substrate 210 with concentrated hydrochloric acid alone or using an etchant other than concentrated hydrochloric acid before the stage of the exposure of the etching stop layer. Referring to FIG. 13, subsequent to the removal of the InAs growth substrate 210, the initial buffer layer 220 and the etching stop layer 230 may be sequentially removed. Since the etching stop layer 230 is made of a GaAsSb-based III-V compound semiconductor, it is not removed with concentrated hydrochloric acid unlike the InAs growth substrate 210. For example, the etching stop layer 230 can be removed by wet etching using an ammonia-hydrogen peroxide mixture.

—Electrode Formation Step—

Figure 15:
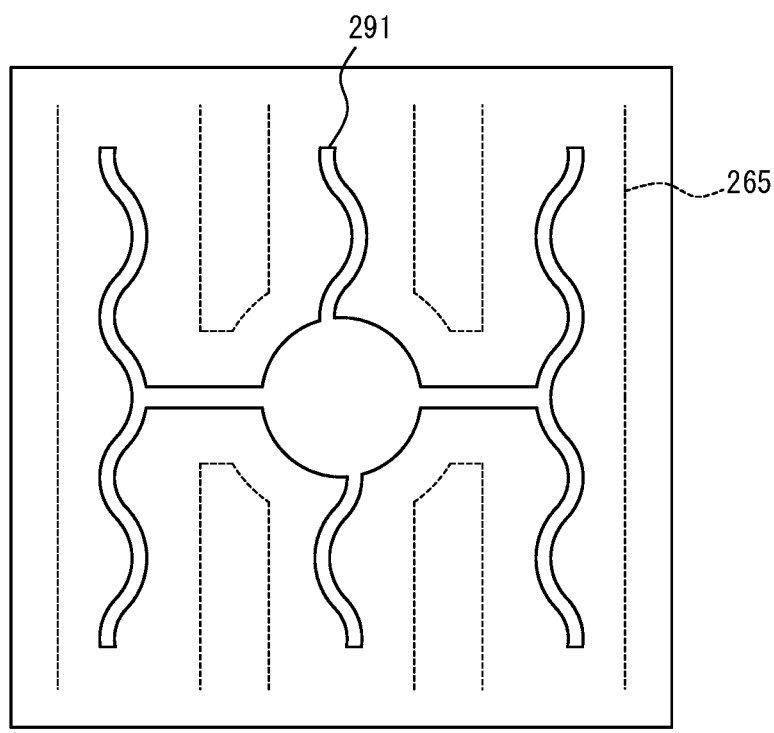
FIG. 15 is a schematic plan view illustrating an example of the shape and the placement of a top electrode in Embodiment 2.

Further, as illustrated in FIG. 15 and FIG. 2 referred to above, the top electrode 291 may be formed on the semiconductor laminate 240 (on the first InAs layer 241 in FIG. 2), and a bottom electrode 295 may be formed on the rear surface of the support substrate 280. The top electrode 291 may include a wiring portion and a pad portion. The top electrode 291 and the bottom electrode 295 can be formed by a known technique; for example, sputtering, electron-beam physical vapor deposition, resistance heating, etc. can be used.

The light-emitting element 200 depicted in FIG. 2 can be obtained by the above production method. As described above, the method of producing the light-emitting element 200 includes at least a step of forming the first InAs layer 241; a step of forming the active layer 245 on the first InAs layer 241; a step of forming the $Al_xIn_{1-x}As$ electron blocking layer 246 on the active layer 245; and a step of forming the second InAs layer 247 on the $Al_xIn_{1-x}As$ electron blocking layer 246. Further, when the components in the light-emitting element 300 depicted in FIG. 3 are formed by the same methods as those for the light light-emitting element 200, the method of producing the light-emitting element 300 includes at least a step of forming the second InAs layer 347; a step of forming the $Al_xIn_{1-x}As$ electron blocking layer 346 on the second InAs layer 347; a step of forming the active layer 345 on the $Al_xIn_{1-x}As$ electron blocking layer 346; and a step of forming the first InAs layer 341 on the active layer 345. In producing the light-emitting elements 200 and 300, the above-described steps including the formation of an etching stop layer and the removal of a growth substrate using the etching stop layer may be performed in addition as appropriate.

EXAMPLES

The following provides a more detailed description of this disclosure using examples. However, this disclosure is not in any way limited by the following examples.

Experimental Examples 1

Example 1

First, an undoped InAs layer was formed to a thickness of 100 nm on the (100) plane of an undoped InAs substrate (substrate thickness: 475 μm). Subsequently, an active layer having a quantum well structure with a dominant emission wavelength of 4.5 μm, a p-type Zn-doped $Al_{0.15}In_{0.85}As$ electron blocking layer (thickness: 15 nm, Zn concentration: $4 \times 10^{18}$ atoms/cm$^3$), and a p-type Zn-doped InAs layer (thickness: 1 μm, Zn concentration: $4.8 \times 10^{18}$ atoms/cm$^3$) were sequentially formed on the undoped InAs layer by MOCVD. Now, for the formation of the active layer having a quantum well structure, after forming an $InAs_{0.99}P_{0.01}$ barrier layer (thickness: 30 nm), 40 $InAs_{0.85}Sb_{0.15}$ well layers (thickness: 10 nm) and 40 $InAs_{0.99}P_{0.01}$ barrier layers (thickness: 30 nm) were alternately stacked to form 40.5 pairs of layers including the barrier layer formed first. Note that as described in the description of the embodiments, both the undoped InAs substrate and the InAs layer were electrically n-type.

Next, on the p-type InAs layer, a p-type ohmic electrode (Ti/Au, total thickness: 1400 nm) was formed in a pattern of the top electrode 291 seen in FIG. 15 by forming a resist pattern, vapor depositing the electrode materials, and lifting the resist pattern off. Note that the ohmic electrode portion 265 illustrated in FIG. 15 was not formed.

A bottom electrode (Ti/Au, total thickness: 210 nm) was formed on the undoped InAs substrate by vapor deposition, and alloying was performed by heat treatment at 300° C. for 1 min. After that, chip singulation was performed by dicing, thus an infrared emission light-emitting element of Example 1 was fabricated. Note that the chip size was 500 μm×500 μm.

Example 2

A light-emitting element of Example 2 was fabricated in the same manner as in Example 1 where the p-type Zn-doped $Al_{0.15}In_{0.85}As$ electron blocking layer was formed, except that the Al composition was changed to $Al_{0.3}In_{0.7}As$.

Example 3

A light-emitting element of Example 3 was fabricated in the same manner as in Example 1 where the p-type Zn-doped $Al_{0.15}In_{0.85}As$ electron blocking layer was formed, except that the Al composition was changed to $Al_{0.075}In_{0.925}As$.

Example 4

A light-emitting element of Example 4 was fabricated in the same manner as in Example 1 where the p-type Zn-doped $Al_{0.15}In_{0.85}As$ electron blocking layer was formed to a thickness of 15 nm, except that the thickness was changed to 30 nm.

Example 5

A light-emitting element of Example 5 was fabricated in the same manner as in Example 1 where the p-type Zn-doped $Al_{0.15}In_{0.85}As$ electron blocking layer was formed to a thickness of 15 nm, except that the thickness was changed to 7.5 nm.

Example 6

A light-emitting element of Example 6 was fabricated in the same manner as in Example 1 where 5 cc of DEZn (diethylzinc) gas was flown as a Zn doping gas in forming the p-type Zn-doped $Al_{0.15}In_{0.85}As$ electron blocking layer, except that the p-type Zn-doped $Al_{0.15}In_{0.85}As$ electron blocking layer was formed without flowing the DEZn gas.

Comparative Example 1

A light-emitting element of Comparative Example 1 was fabricated in the same manner as in Example 1 where the p-type Zn-doped $Al_{0.15}In_{0.85}As$ electron blocking layer was formed to a thickness of a thickness of 15 nm, except that a p-type InAs layer was formed directly on the active layer without forming the p-type Zn-doped $Al_{0.15}In_{0.85}As$ electron blocking layer.

Comparative Example 2

A light-emitting element of Comparative Example 2 was fabricated in the same manner as in Example 1 where the p-type Zn-doped $Al_{0.15}In_{0.85}As$ electron blocking layer was formed, except that the Al composition was changed to $Al_{0.60}In_{0.40}As$.

Comparative Example 3

A light-emitting element of Comparative Example 3 was fabricated in the same manner as in Example 1 where the p-type Zn-doped $Al_{0.15}In_{0.85}As$ electron blocking layer was formed to a thickness of 15 nm, except that the thickness was changed to 60 nm.

<Evaluation: Evaluation of Light Output Power>

A current of 300 mA was supplied to each of the light-emitting elements obtained in Examples 1 to 6 and Comparative Examples 1 to 3 using a constant current constant voltage power supply. For each element, the forward voltage Vf and the light output power Po then at a point were measured; the light output power Po was measured using an integrating sphere. The results are given in Tables 1 to 3. Note that each table also gives the emission peak wavelength ($\lambda_p$) and the light emission efficiency WPE (=Po/$(I_f V_f)$).

TABLE 1

| | Solid phase ratio of Al in electron blocking layer | Po (µW) | Vf (V) | $\lambda_p$ (µm) | WPE (%) |
|---|---|---|---|---|---|
| Comparative Example 1 | — | 48.0 | 0.345 | 4.49 | 0.0464 |
| Example 3 | 0.075 | 58.5 | 0.363 | 4.52 | 0.0537 |
| Example 1 | 0.15 | 75.1 | 0.384 | 4.55 | 0.0651 |
| Example 2 | 0.30 | 75.7 | 0.380 | 4.51 | 0.0663 |
| Comparative Example 2 | 0.60 | 70.7 | 0.887 | 4.38 | 0.0266 |

TABLE 2

| | Thickness of electron blocking layer (nm) | Po (µW) | Vf (V) | $\lambda_p$ (µm) | WPE (%) |
|---|---|---|---|---|---|
| Comparative Example 1 | — | 48.0 | 0.345 | 4.49 | 0.0464 |
| Example 5 | 7.5 | 58.0 | 0.370 | 4.55 | 0.0522 |
| Example 1 | 15 | 75.1 | 0.384 | 4.55 | 0.0651 |
| Example 4 | 30 | 76.4 | 0.387 | 4.50 | 0.0658 |
| Comparative Example 3 | 60 | 42.0 | 0.467 | 4.33 | 0.0300 |

TABLE 3

| | Zn flown for forming electron blocking layer (cc) | Po (µW) | Vf (V) | $\lambda_p$ (µm) | WPE (%) |
|---|---|---|---|---|---|
| Comparative Example 1 | — | 48.0 | 0.345 | 4.49 | 0.0464 |
| Example 6 | 0 | 77.5 | 0.485 | 4.35 | 0.0533 |
| Example 1 | 5 | 75.1 | 0.384 | 4.55 | 0.0651 |

The results of Examples 1 to 6 and Comparative Examples 1 to 3 above demonstrate that the light emission efficiency (WPE) can be increased by forming an $Al_xIn_{1-x}As$ electron blocking layer ($0.05 \leq x \leq 0.4$) with a thickness of 5 nm to 40 nm between an active layer and a p-type InAs layer (the second InAs layer in the embodiments). In order to increase the light emission efficiency, both the thickness and the Al composition ratio x necessarily satisfy the conditions according to this disclosure. Further, comparing the results of Example 1 and Example 6, it was found that although the electron blocking layer had an light emission efficiency improving effect even when undoped, the light emission efficiency was further improved when Zn doping was performed.

Experimental Example 2

In Experimental Example 1 above, light-emitting elements using an InAs substrate being a growth substrate directly as a substrate were evaluated. Next, a bonded light-emitting element obtained by removing the InAs substrate used as a growth substrate was fabricated.

Example 7

First, an undoped InAs layer was formed to a thickness of 100 nm on the (100) plane of an undoped InAs substrate (substrate thickness: 475 µm). Next, a superlattice laminate (etching stop layer) in which 113 pairs of undoped GaSb layers (thickness: 0.9 nm) and $GaAs_{0.34}Sb_{0.66}$ layers (thickness: 0.1 nm) were stacked was formed. Subsequently, after forming an n-type Te-doped InAs layer (thickness: 1 µm) on the superlattice laminate, an active layer having a quantum well structure with a dominant emission wavelength of 4.5 µm, a p-type Zn-doped $Al_{0.15}In_{0.85}As$ electron blocking layer (thickness: 15 nm, Zn concentration: $4 \times 10^{18}$ atoms/$cm^3$), and a p-type Zn-doped InAs layer (thickness: 1 µm, Zn concentration: $4.8 \times 10^{18}$ atoms/$cm^3$) were sequentially formed by MOCVD as in Example 1. Now, for the formation of the active layer having a quantum well structure, after forming an $InAs_{0.99}P_{0.01}$ barrier layer (thickness: 30 nm), 40 $InAs_{0.85}Sb_{0.15}$ well layers (thickness: 10 nm) and 40 $InAs_{0.99}P_{0.01}$ barrier layers (thickness: 30 nm) were alternately stacked to form 40.5 pairs of layers including the barrier layer formed first.

Next, a transparent insulating layer (thickness: 550 nm) made of $SiO_2$ was formed on the entire surface of the p-type InAs layer by plasma CVD. A pattern as illustrated in FIG. 14 was formed thereon using a resist, and $SiO_2$ was partly removed by wet etching using BHF to form a through hole, thus the p-type InAs layer was exposed. Subsequently, a p-type ohmic electrode portion (Ti/Au, total thickness: 540 nm) was formed in the through hole by vapor deposition and lift-off of the resist pattern so that parts of the transparent insulating layer and the p-type ohmic electrode portion were formed in parallel, thus a distribution portion (also serving as a current spreading layer) was formed. FIG. 14 illustrates a top electrode to be formed, by the broken lines.

Next, on the entire surface of the distribution portion, a metal reflective layer (Al/Au/Pt/Au) was formed by vapor deposition. The thickness of the metal layers in the metal reflective layer was 10 nm, 650 nm, 100 nm, and 900 nm in this order.

On the other hand, a metal bonding layer (Ti/Pt/Au) was formed on a conductive Si substrate (substrate thickness:

200 µm) serving as a support substrate. The thickness of the metal layers in the metal bonding layer was 650 nm, 20 nm, and 900 nm in this order.

The metal reflective layer and the metal bonding layer were placed to face each other, and were subjected to thermocompression bonding at 300° C. Immersion was then performed in such a manner that at least the InAs substrate, the initial buffer layer, and the etching stop layer were immersed in concentrated hydrochloric acid (produced by KANTO CHEMICAL CO., INC.) with a concentration of 12 M for 10.5 h in a beaker placed in a hot bath maintained at 25° C. Thus the InAs substrate and the initial buffer layer were removed to expose the superlattice laminate (etching stop layer) including the GaSb layers and the $GaAs_{0.34}Sb_{0.66}$ layers. Subsequently, after cleaning with pure water and drying, the superlattice laminate (etching stop layer) was removed by wet etching using an ammonia-hydrogen peroxide mixture, thus the n-type InAs layer was exposed.

Next, on the n-type InAs layer, an n-type electrode (Ti (thickness: 150 nm)/Au (thickness: 1250 nm)) was formed in a pattern as illustrated in FIG. 15 by forming a resist pattern, vapor depositing the n-type electrode materials, and lifting the resist pattern off. FIG. 15 illustrates the pattern of the p-type ohmic electrode portion having been formed, by the broken lines.

Finally, a bottom electrode (Ti (thickness: 10 nm)/Pt (thickness: 50 nm)/Au (thickness: 200 nm)) was formed on the rear surface side of the Si substrate, and alloying was performed by heat treatment at 300° C. for 1 min. After that, chip singulation was performed by dicing, thus a light-emitting element of Example 7 was fabricated. Note that the chip size was 500 µm×500 µm.

<Evaluation>

A current of 300 mA was supplied to the light-emitting element of Example 7 using a constant current constant voltage power supply as in Example 1. In this case, the forward voltage Vf was 0.352 V, the light output power Po measured using an integrating sphere was 75.3 µW, the peak wavelength λp was 4.2 µm, and the WPE was 0.0713%. Even when the bonding to the support substrate was performed after removing the substrate, the light emission efficiency was improved by forming the electron blocking layer, as in Examples 1 to 6, compared with the case where the electron blocking layer was not formed.

INDUSTRIAL APPLICABILITY

This disclosure provides a light-emitting element that exhibits improved light emission efficiency.

REFERENCE SIGNS LIST

100: Light-emitting element
105: Substrate
140: Semiconductor laminate
141: First InAs layer
145: Active layer
145w: $InAs_ySb_{1-y}$ layer (well layer)
145b: $InAs_zP_{1-z}$ layer (barrier layer)
146: $Al_xIn_{1-x}As$ electron blocking layer
147: Second InAs layer
191: Top electrode
195: Bottom electrode
200: Light-emitting element
210: InAs growth substrate
220: Initial buffer layer
230: Etching stop layer
230a: GaAsSb-based III-V compound semiconductor
230b: GaAsSb-based III-V compound semiconductor
240: Semiconductor laminate
241: First InAs layer
245: Active layer
246: $Al_xIn_{1-x}As$ electron blocking layer
247: Second InAs layer
260: Distribution portion
261: Transparent insulating layer
261A: Through hole
265: Ohmic electrode portion
271: Metal reflective layer
279: Metal bonding layer
280: Support substrate
291: Top electrode
295: Bottom electrode
300: Light-emitting element
340: Semiconductor laminate
341: First InAs layer
345: Active layer
346: $AlxIn_{1-x}As$ electron blocking layer
347: Second InAs layer
380: Support substrate

The invention claimed is:

1. A light-emitting element comprising a semiconductor laminate including, in the following order:
   a first InAs layer that is undoped or doped with an n-type dopant;
   an active layer including one or more $InAs_ySb_{1-y}$ layers where $0<y<1$;
   an $Al_xIn_{1-x}As$ electron blocking layer with a thickness of 5 nm to 40 nm, where $0.3 \leq x \leq 0.4$; and
   a second InAs layer doped with a p-type dopant, wherein the $Al_xIn_{1-x}As$ electron blocking layer is doped with a Zn dopant, and
   a concentration of the Zn dopant is $2 \times 10^{18}$ atoms/cm$^3$ or more and $8 \times 10^{18}$ atoms/cm$^3$ or less.

2. The light-emitting element according to claim 1, wherein the active layer further includes $InAs_zP_{1-z}$ layers where $0<z<1$, and
   the active layer has a quantum well structure in which the $InAs_ySb_{1-y}$ layers are well layers and the $InAs_zP_{1-z}$ layers are barrier layers.

3. The light-emitting element according to claim 1, wherein an emission peak wavelength of light emitted from the active layer is 3.4 µm or more.

4. The light-emitting element according to claim 1, comprising:
   a support substrate;
   a metal bonding layer provided on a surface of the support substrate;
   a distribution portion including a transparent insulating layer having a through hole and an ohmic electrode portion provided in the through hole, the distribution portion being provided on the metal bonding layer; and
   the semiconductor laminate provided on the distribution portion.

5. A method of producing the light-emitting element according to claim 1, comprising:
   a step of forming the first InAs layer;
   a step of forming the active layer on the first InAs layer;
   a step of forming the $Al_xIn_{1-x}As$ electron blocking layer on the active layer; and
   a step of forming the second InAs layer on the $Al_xIn_{1-x}As$ electron blocking layer.

6. A method of producing the light-emitting element according to claim 1, comprising:
- a step of forming the second InAs layer;
- a step of forming the $Al_xIn_{1-x}As$ electron blocking layer on the second InAs layer;
- a step of forming the active layer on the $Al_xIn_{1-x}As$ electron blocking layer; and
- a step of forming the first InAs layer on the active layer.

* * * * *